United States Patent
Bae et al.

(10) Patent No.: US 8,710,673 B2
(45) Date of Patent: *Apr. 29, 2014

(54) WIRING STRUCTURE IN A SEMICONDUCTOR DEVICE, METHOD OF FORMING THE WIRING STRUCTURE, SEMICONDUCTOR DEVICE INCLUDING THE WIRING STRUCTURE AND METHOD OF MANUFACTURING THE SEMICONDUCTOR DEVICE

(71) Applicant: Samsung Electronics Co., Ltd., Suwon-si (KR)

(72) Inventors: Ki-Soon Bae, Suwon-si (KR); Sei-Ryung Choi, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/722,662

(22) Filed: Dec. 20, 2012

(65) Prior Publication Data

US 2013/0113113 A1 May 9, 2013

Related U.S. Application Data

(60) Continuation of application No. 13/099,816, filed on May 3, 2011, now abandoned, which is a division of application No. 11/771,939, filed on Jun. 29, 2007, now Pat. No. 7,956,386.

(30) Foreign Application Priority Data

Jul. 3, 2006 (KR) .................. 10-2006-0061792

(51) Int. Cl.
    *H01L 29/40* (2006.01)

(52) U.S. Cl.
    USPC .... 257/774; 257/763; 257/765; 257/E21.584; 438/672; 438/253; 438/255; 438/396

(58) Field of Classification Search
    CPC .................. H01L 21/76805; H01L 21/76834; H01L 21/76855; H01L 23/5226
    USPC ................. 438/672, 253, 255, 396, 398, 340; 257/763–767, 783, 753
    See application file for complete search history.

(56) References Cited

U.S. PATENT DOCUMENTS

| 6,251,790 B1 | 6/2001 | Jeong |
| 6,268,658 B1 | 7/2001 | Todorobaru et al. |
| 7,956,386 B2 | 6/2011 | Bae et al. |
| 2002/0056916 A1 | 5/2002 | Ichise et al. |
| 2003/0162353 A1 | 8/2003 | Park |
| 2005/0101081 A1 | 5/2005 | Goda et al. |

(Continued)

FOREIGN PATENT DOCUMENTS

| JP | 2003-249572 | 9/2003 |
| KR | 1999-0035652 | 5/1999 |

(Continued)

OTHER PUBLICATIONS

"Wiring Structure in a Semiconductor Device, Method of Forming the Wiring Structure . . . " Specification, Drawings and Prosecution History, of U.S. Appl. No. 11/771,939, filed Jun. 29, 2007, by Ki-Soon Bae, et al., which is stored in the U.S. Patent and Trademark Office (USPTO).

(Continued)

*Primary Examiner* — Mark A Laurenzi
(74) *Attorney, Agent, or Firm* — Onello & Mello, LLP (57) ABSTRACT

A wiring structure in a semiconductor device may include a first insulation layer formed on a substrate, a first contact plug, a capping layer pattern, a second insulation layer and a second contact plug. The first insulation layer has a first opening that exposes a contact region of the substrate. The first contact plug is formed on the contact region to partially fill up the first opening. The capping layer pattern is formed on the first contact plug to fill up the first opening. The second insulation layer is formed on the capping layer pattern and the first insulation layer. The second insulation layer has a second opening passing through the capping layer pattern to expose the first contact plug. The second contact plug is formed on the first contact plug in the second opening. Since the wiring structure includes the capping layer pattern, the wiring structure may prevent a contact failure by preventing chemicals from permeating into the first contact plug.

8 Claims, 9 Drawing Sheets

(56) References Cited

U.S. PATENT DOCUMENTS

2007/0123040 A1 5/2007 Hwang et al.
2008/0003866 A1 1/2008 Bae et al.
2011/0207271 A1 8/2011 Bae et al.

FOREIGN PATENT DOCUMENTS

| KR | 10-0351933 | 3/2002 |
|----|------------|--------|
| KR | 10-2004-0059822 | 7/2004 |
| KR | 10-2006-0030200 | 4/2006 |

OTHER PUBLICATIONS

"Wiring Structure in a Semiconductor Device, Method of Forming the Wiring Structure . . . " Specification, Drawings and Prosecution History, of U.S. Appl. No. 13/099,816, filed May 3, 2011, by Ki-Soon Bae, et al., which is stored in the U.S. Patent and Trademark Office (USPTO).

WIRING STRUCTURE IN A SEMICONDUCTOR DEVICE, METHOD OF FORMING THE WIRING STRUCTURE, SEMICONDUCTOR DEVICE INCLUDING THE WIRING STRUCTURE AND METHOD OF MANUFACTURING THE SEMICONDUCTOR DEVICE

CROSS-REFERENCE TO RELATED APPLICATIONS

This application is a continuation application of U.S. patent application Ser. No. 13/099,816, filed on May 3, 2011, which is a divisional application of U.S. patent application Ser. No. 11/771,939, filed on Jun. 29, 2007, now U.S. Pat. No. 7,956,386, issued on Jun. 7, 2011, which claims the benefit of foreign priority under 35 USC §119 to Korean Patent Application No. 10-2006-0061792 filed on Jul. 3, 2006, the entire contents of which applications are herein incorporated herein in their entirety by reference.

BACKGROUND

1. Field of Invention

Example embodiments of the present invention relate generally to wiring structures in semiconductor devices, methods of forming wiring structures, semiconductor devices including wiring structures, and methods of manufacturing semiconductor devices including wiring structures. More particularly, example embodiments of the present invention relate to a wiring structure in a semiconductor device capable of preventing a contact failure, a method of forming such a wiring structure, a semiconductor device including such a wiring structure, and a method of manufacturing a semiconductor device including such a wiring structure.

2. Description of the Related Art

As electronic devices such as computers or cellular phones continue to be widely used, semiconductor devices have rapidly improved. To meet various requirements of various devices, semiconductor device must typically have high response speeds and large storage capacities. Thus, semiconductor manufacturing technology continues to evolve so as to ensure a high degree of integration, improved reliability and high speed of the semiconductor device. When semiconductor devices become highly integrated, conductive wirings and contact plugs that transfer signals in the semiconductor device may have minute dimensions. That is, wirings and contact plugs in a conventional semiconductor device may have minute widths and an interval between the wirings may also be considerably reduced. As the widths of wirings in conventional semiconductor devices become smaller, it becomes more difficult to form the wirings by conventional manufacturing processes. Additionally, it may be difficult to form contact plugs that connect adjacent wirings at desired positions because contact plugs in conventional semiconductor device generally have a high aspect ratio. These problems of the conventional semiconductor device will be described as follows.

According to conventional semiconductor fabrication processes, a contact hole exposing a desired conductive wiring or an underlying contact plug is formed through an insulation layer by a photolithography process, and then the contact plug is formed in the contact hole. As the contact hole has a reduced size, an alignment error margin of the contact hole is also reduced. As a result, the likelihood that the contact hole will be misaligned relative to the conductive wiring or contact plug increases. If a misaligned contact hole exposes an undesired adjacent conductive wiring, the contact plug formed in the contact hole may cause a failure such as a bridge between adjacent conductive wirings.

After forming the contact hole through the insulation layer, a wet cleaning process or a wet etching process is usually performed using chemicals to enlarge a width of the contact hole. However, the chemicals may permeate into an underlying contact plug or conductive wiring when the cleaning process or the etching process is carried out excessively. As a result, the underlying contact plug or conductive wiring can become damaged. When damaged, the underlying contact plug or conductive wiring may contribute to an electrical failure of the semiconductor device. Generally, damage incurred by the underlying contact plug or conductive wiring increases as the alignment error of the contact plug increases. For example, when the chemicals permeate into upper portions or lateral portions of the underlying contact plug or conductive wiring, conductive material in the contact plug or conductive wiring may become melted or eroded by the chemicals. When the contact plug or the conductive wiring is partially melted or eroded by the chemicals, a contact resistance of the contact plug or conductive wiring can increase considerably or a contact failure of the contact plug or conductive wiring may occur. Recently, it has been discovered that the contact plug may incur serious damage by the permeated chemicals since the contact plug generally includes reactive metal or metal silicide.

SUMMARY

Example embodiments disclosed herein describe a wiring structure in a semiconductor device without a contact failure thereof. Example embodiments disclosed herein describe a method of forming a wiring structure in a semiconductor device without a contact failure by preventing chemicals from permeating therein. Example embodiments disclosed herein describe a semiconductor device including a wiring structure to ensure improved electrical characteristics. Example embodiments disclosed herein describe a method of manufacturing a semiconductor device including a wiring structure to ensure improved electrical characteristics.

One embodiment exemplarily disclosed herein may be characterized as a semiconductor device that includes a first insulation layer located on a substrate. The first insulation layer may have a first opening defined therein that exposes a contact region of the substrate. A first contact plug may be located within the first opening and on the contact region. A capping layer pattern may be located within the first opening and on the first contact plug. A second insulation layer may be located on the capping layer pattern and the first insulation layer. The second insulation layer may have a second opening defined therein that is further defined within the capping layer pattern and exposes the first contact plug. A second contact plug may be located within the second opening and on the first contact plug.

Another embodiment exemplarily disclosed herein may be characterized as a method of forming a semiconductor device that includes forming a first insulation layer on a substrate. A first opening may be formed through the first insulation layer. The first opening may expose a contact region of the substrate. A first contact plug may be formed within the first opening to partially fill the first opening. The first contact plug may be located on the contact region. A preliminary capping layer pattern may be formed within the first opening and on the first contact plug. A second insulation layer may be formed on the preliminary capping layer pattern and the first insulation layer. The second insulation layer and the preliminary capping layer pattern may be partially etched to form a capping layer pattern and a second opening exposing the first contact plug. A second contact plug may be formed within the second opening and on the first contact plug.

Still another embodiment exemplarily disclosed herein may be characterized as a semiconductor device that includes a first insulating interlayer located on a substrate having a first impurity region and a second impurity region. The first insulating interlayer may have a first opening and a second opening defined therein. The first opening may expose the first impurity region and the second opening exposing the second impurity region. A first contact structure may be located in the first opening and include a first contact plug and a first capping layer pattern. A second contact structure may be located in the second opening and include a second contact plug and a second capping layer pattern. A second insulating interlayer may be located on the first insulating interlayer and on the first and the second capping layer patterns. The second insulating interlayer may have a third opening defined therein that is further defined within the first capping layer pattern to expose the first contact plug. A bit line may be located in the third opening and be electrically connected to the first contact plug. A third insulating interlayer may be located on the second insulating interlayer and cover the bit line. The third insulating interlayer may have a fourth opening defined therein, wherein the fourth opening is further defined within the second capping layer pattern to expose the second contact plug. A storage node contact plug may be located in the fourth opening and electrically connected to the second contact plug.

Yet another embodiment exemplarily disclosed herein may be characterized as a method of manufacturing a semiconductor device that includes forming a first impurity region and a second impurity region at upper portions of a substrate. A first insulating interlayer may be formed on the substrate. A first opening and a second opening may be foamed through the first insulating interlayer to expose the first impurity region and the second impurity region, respectively. A preliminary first contact structure including a first contact plug and a preliminary first capping layer pattern may be formed in the first opening. A preliminary second contact structure including a second contact plug and a preliminary second capping layer pattern may be formed in the second opening. A second insulating interlayer may be formed on the first insulating interlayer and the preliminary first and the preliminary second capping layer patterns. A first contact structure including the first contact plug and a first capping layer pattern may be formed by forming a third opening passing through the second insulating interlayer and the preliminary first capping layer pattern to expose the first contact plug. A bit line may be formed in the third opening and be electrically connected to the first contact plug. A third insulating interlayer may be formed on the second insulating interlayer to cover the bit line. A second contact structure including the second contact plug and a second capping layer pattern may be formed by forming a fourth opening passing through the third insulating interlayer and the preliminary second capping layer pattern to expose the second contact plug. A storage node contact plug may be formed in the fourth opening and be electrically connected to the second contact plug.

BRIEF DESCRIPTION OF THE DRAWINGS

The above and other features and advantages of the present invention will become more apparent by describing in detailed example embodiments thereof with reference to the accompanying drawings, in which.

DETAILED DESCRIPTION

Example embodiments of the present invention will now be described more fully with reference to the accompanying drawings. These embodiments may, however, be realized in many different forms and should not be construed as limited to the example embodiments set forth herein. Rather, these example embodiments are provided so that this disclosure will be thorough and complete, and will fully convey the scope of the invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the embodiments exemplarily disclosed herein.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, example embodiments disclosed herein should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
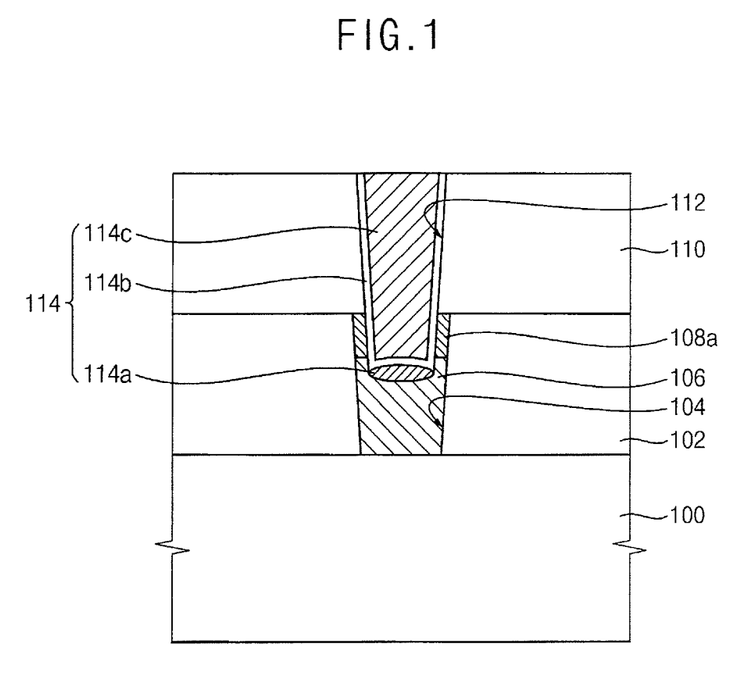
FIG. 1 is a cross-sectional view illustrating a wiring structure in a semiconductor device according to one embodiment.

FIG. 1 is a cross-sectional view illustrating a wiring structure in a semiconductor device according to one embodiment.

Referring to FIG. 1, the wiring structure may, for example, include a first insulation layer 102, a first contact plug 106, a capping layer pattern 108a, a second insulation layer 110, and a second contact plug 114.

The first insulation layer 102 may be provided on a substrate 100. The substrate 100 may include a semiconductor substrate, for example, a silicon substrate, a germanium substrate, a silicon-on-insulator (SOI) substrate, a germanium-on-insulator (GOI) substrate and so on. The first insulation layer 102 may include a first opening 104 that exposes a portion of the substrate 100 where a contact will be formed.

In some embodiments, the exposed portion of the substrate 100 may correspond to a contact region and the first insulation layer 102 may correspond to a lower insulating interlayer. The contact region may, for example, include an impurity region. Further, a plug and/or a conductive pattern may be provided in the contact region. The plug and the conductive pattern may, for example, include polysilicon doped with impurities. Alternatively, the plug and/or the conductive pattern may include polysilicon doped with impurities, metal, conductive metal nitride, or the like or a combination thereof.

The first insulation layer 102 may, for example, include an oxide such as silicon oxide. For example, the first insulation layer 102 may include undoped silicate glass (USG), spin-on-glass (SOG), phosphor silicate glass (PSG), boron silicate glass (BSG), boro-phosphor silicate glass (BPSG), tetraethylorthosilicate (TEOS), flowable oxide (FOX), high density plasma-chemical vapor deposition (HDP-CVD) oxide, or the like or a combination thereof.

In some embodiments, the first insulation layer 102 may cover a lower structure provided on the substrate 100. The lower structure may, for example, include a gate structure, a transistor, etc.

The first contact plug 106 may be formed on the contact region of the substrate 100 and within the first opening 106. In one embodiment, the first contact plug 106 may partially fill the first opening 104. The first contact plug 106 may, for example, include polysilicon doped with impurities, a metal, a metal nitride, or the like or a combination thereof. For example, the first contact plug 106 may include titanium, tantalum, tungsten, aluminum, titanium nitride, tungsten nitride, tantalum nitride, titanium aluminum nitride, or the like, either singly or in a layered or unlayered combination thereof. In one example embodiment, the first contact plug 106 may have a single-layered structure that includes a polysilicon film, a metal film or a metal nitride film. In another example embodiment, the first contact plug 106 may have a multi-layered structure that includes a polysilicon film, a metal film and/or a metal nitride film.

The capping layer pattern 108a may be formed on the first contact plug 106 within the first opening. In one embodiment, the capping layer pattern 108a may fill the first opening 104. The capping layer pattern 108a may cover a peripheral region of the upper surface of the first contact plug 106 and may contact a sidewall of the first opening 104. Thus, the capping layer pattern 108a may be characterized as having a ring structure, a cylindrical structure, a hollow polygonal pillar structure, a cup structure, etc. The capping layer pattern 108a may prevent chemicals from permeating into the first contact plug 106 during subsequent processes. Further, the capping layer pattern 108a may improve a contact between the first contact plug 106 and the second contact plug 114 formed on the first contact plug 106 so that a contact failure between the first and the second contact plugs 106 and 114 may be prevented. The capping layer pattern 108a may include a material having an etching selectivity relative to the first insulation layer 102 and the first contact plug 106. For example, the capping layer pattern 108a may include a nitride such as silicon nitride or an oxynitride such as silicon oxynitride.

The capping layer pattern 108a may have an upper surface that is substantially coplanar with an upper surface of the first insulation layer 102. Accordingly, a total height of the capping layer pattern 108a and the first contact plug 106 may be substantially the same as a height of the first insulation layer 102. Alternatively, the upper surface of the capping layer pattern 108a may be substantially lower than the upper surface of the first insulation layer 102.

When a height of the first contact plug 106 is less than about 60 percent of the depth of the first opening 104, the capping layer pattern 108a may be relatively thick. As a result, the second contact plug 114 may not accurately make contact with the first contact plug 106. However, when the height of the first contact plug 106 is greater than about 90 percent of the depth of the first opening 104, the capping layer pattern 108a may be relatively thin. As a result, the capping layer pattern 108a may not effectively prevent the chemicals from permeating into the first contact plug 106. Therefore, the height of the first contact plug 106 may range from about 60 to about 90 percent of the depth of the first opening 104.

The second insulation layer 110 is provided on the capping layer pattern 108a and the first insulation layer 102. The second insulation layer 110 may, for example, include an oxide such as silicon oxide. For example, the second insulation layer 110 may include USG, SOG, FOX, BSG, BPSG, TEOS, HDP-CVD oxide, or the like or a combination thereof. When the first insulation layer 102 corresponds to a lower insulating interlayer, the second insulation layer 110 may correspond to an upper insulating interlayer. In one embodiment, the second insulation layer 110 may include a material substantially the same as that of the first insulation layer 102. In another embodiment, the first and the second insulation layers 102 and 110 may include different materials.

A second opening 112 may be formed through the second insulation layer 110 and the capping layer pattern 108a. Accordingly, the first contact plug 106 may be exposed by the second opening 112. The second contact plug 114 may be formed on the first contact plug 106 within the second opening 112. In one embodiment, the second contact plug 114 may substantially fill the second opening 112. The second contact plug 114 may, for example, include a barrier metal layer 114b and a metal layer 114c. The barrier metal layer 114b may be formed on the first contact plug 106 and a sidewall of the second opening 112. The metal layer 114c may be positioned on the barrier metal layer 114b to substantially fill the second opening 112. The second contact plug 114 may further include a metal silicide layer 114a formed between the first contact plug 106 and the barrier metal layer 114b. The metal silicide layer 114a may serve as an ohmic layer for providing an ohmic contact between the first contact plug 106 and the second contact plug 114.

In some embodiments, the barrier metal layer 114b may include a metal film and a metal nitride film. For example, the barrier metal layer 114b may include a titanium film and a titanium nitride film. The metal silicide layer 114a may include a titanium silicide when the barrier metal layer 114b includes titanium. Alternatively, the metal silicide layer 114a may include another metal silicide such as cobalt silicide, tantalum silicide, tungsten silicide, etc. The metal layer 114c may, for example, include tungsten, titanium, aluminum, copper, tantalum, or the like or a combination thereof. For example, the metal layer 114c may include tungsten.

In the illustrated embodiment, the capping layer pattern 108a is formed on the first contact plug 106 to enclose a lower portion of the second contact plug 114 contacting the first contact plug 106. Additionally, an upper surface of the capping layer pattern 108a may be substantially coplanar with or lower than the upper surface of the first insulation layer 102. Furthermore, the metal silicide layer 114a between the first and the second contact plugs 106 and 114 may be positioned to be lower than a lower surface of the capping layer pattern 108a. Therefore, the capping layer pattern 108a may effectively prevent the chemicals from permeating into a contact portion between the first and the second contact plugs 106 and 114. As a result, the metal silicide layer 114a may be effectively protected by the capping layer pattern 108a to thereby prevent a contact failure between the first contact plug 106 and the second contact plug 114.

FIGS. 2 to 6 are cross-sectional views illustrating an exemplary method of forming the wiring structure in FIG. 1.

Figure 2:
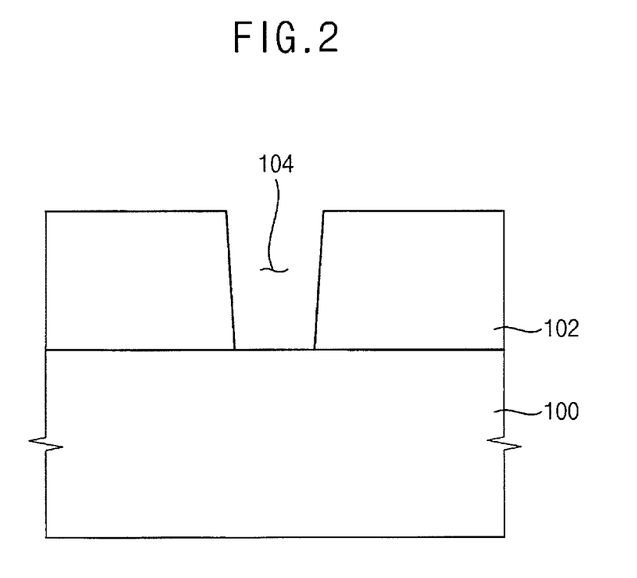
FIGS. 2 to 6 are cross-sectional views illustrating an exemplary method of forming the wiring structure in FIG. 1.

Referring to FIG. 2, a first insulation layer 102 is formed on a substrate 100. The first insulation layer 102 may, for example, include an oxide such as silicon oxide. In one embodiment, the first insulation layer 102 may be formed by a chemical vapor deposition (CVD) process.

The first insulation layer 102 may be partially etched to form a first opening 104 that exposes a portion of the substrate 100 where a contact region is positioned. In one embodiment, the first opening 104 may be formed by a photolithography process.

Figure 3:
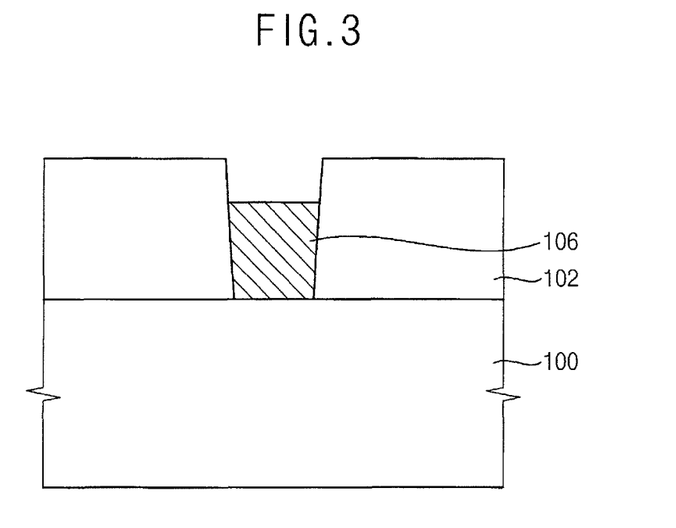

Referring to FIG. 3, a first conductive layer (not shown) may be formed on the first insulation layer 102 within the first opening 104. In one embodiment, the first conductive layer may substantially fill the first opening 104. The first conductive layer may, for example, include doped polysilicon, metal, metal nitride, or the like or a combination thereof. In one embodiment, the first conductive layer may be formed by a CVD process, a sputtering process, or the like or a combination thereof. In one embodiment, the first conductive layer may be planarized by, for example, a chemical mechanical polishing (CMP) process.

The first conductive layer may then be partially etched until the first insulation layer 102 is exposed, thereby forming a first contact plug 106 in the first opening 104. The first contact plug 106 may be formed on the contact region to partially fill the first opening 104. Accordingly, a height of the first contact plug 106 may be less than a thickness of the first insulation layer 102. In some embodiments, the height of the first contact plug 106 may range from about 60 to about 90 percent of a depth of the first opening 104 (i.e., the thickness of the first insulation layer 102).

Figure 4:
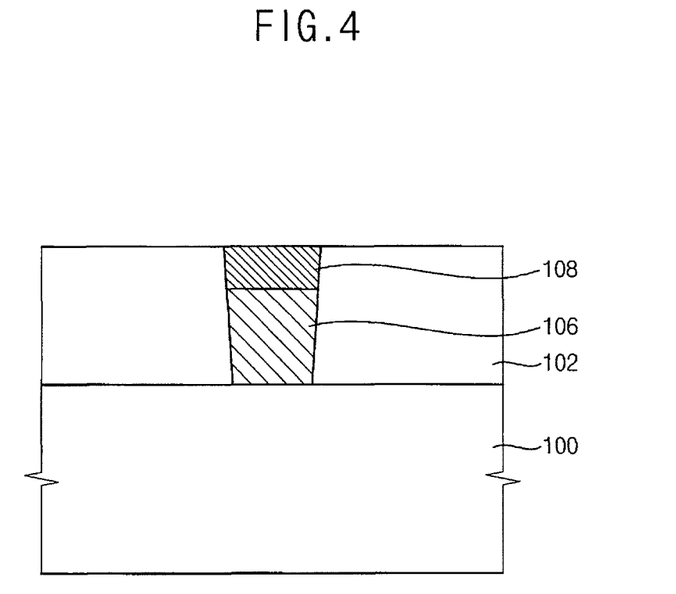

Referring to FIG. 4, a capping layer (not illustrated) may be formed on the first insulation layer 102 within the first opening 104. In one embodiment, the capping layer may substantially fill the first opening 104. The capping layer may include a material that has an etching selectivity relative to the first insulation layer 102 and the first contact plug 106. For example, the capping layer may be formed using silicon nitride or silicon oxynitride. In one embodiment, the capping layer may be formed by a CVD process.

The capping layer may then be partially removed until the first insulation layer 102 is exposed to form a preliminary capping layer pattern 108 on the first contact plug 106 and within the first opening 104. If the capping layer is partially removed by a CMP process to form the preliminary capping layer pattern 108, then the first insulation layer 102 may be partially removed along with the capping layer because a polishing end point may not be precisely determined during the CMP process. Accordingly, the capping layer may be partially removed by an etch-back process to form the preliminary capping layer pattern 108 since an etch-back process is capable of selectively removing the capping layer with respect to the first insulation layer 102.

An upper surface of the preliminary capping layer pattern 108 may be substantially coplanar with, or lower than, the upper surface of the first insulation layer 102. Accordingly, a total height of the preliminary capping layer pattern 108 and the first contact plug 106 may be substantially the same as or less than the thickness of the first insulation layer 102.

Figure 5:
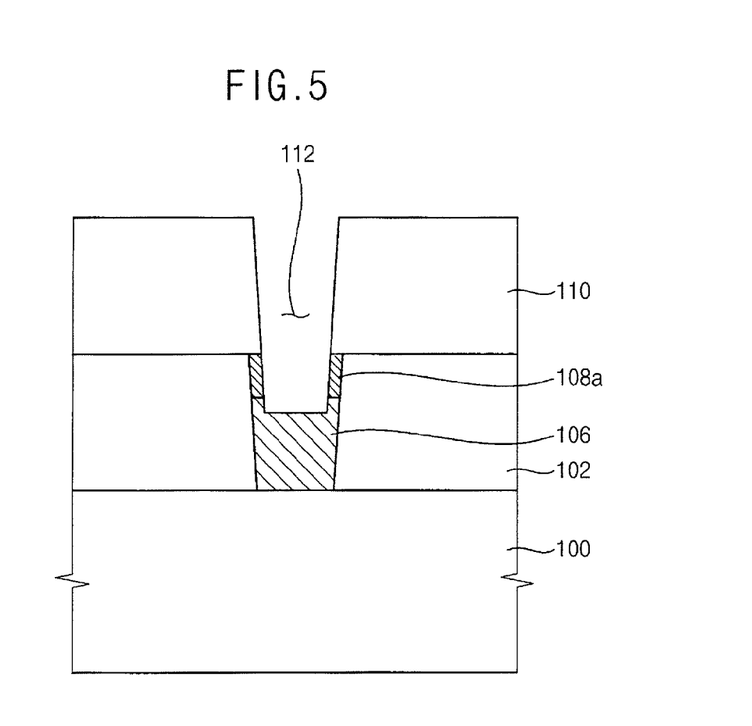

Referring to FIG. 5, a second insulation layer 110 may be formed on the preliminary capping layer pattern 108 and the first insulation layer 102. In one embodiment, the second insulation layer 110 may, for example, include an oxide such as silicon oxide and be formed by a CVD process.

The second insulation layer 110 and the preliminary capping layer pattern 108 may then be partially etched until the first contact plug 106 is exposed. As a result of the partial etching, a second opening 112 may be formed through the second insulation layer 110 and the preliminary capping layer pattern 108. The second opening 108 may have a width that may be substantially less than a height of the first insulation layer 102. In addition, the width of the second opening 108 may be substantially less than a width of the first opening 104. In the illustrated embodiment, an upper portion of the first contact plug 106 may be slightly etched to provide a recess on the first contact plug 106.

Upon forming the second opening 112, the preliminary capping layer pattern 108 is patterned into a capping layer pattern 108a. The capping layer pattern 108a may, for example, be characterized as a hollow polygonal pillar structure, a cylindrical structure, a ring structure, a cup structure, etc.

Figure 6:
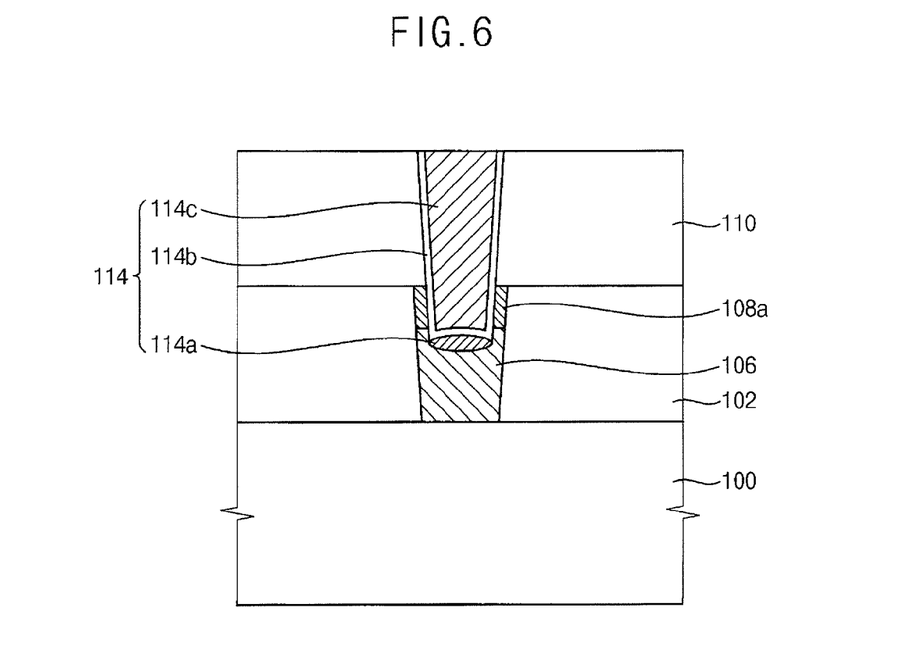

Referring to FIG. 6, a second contact plug 114 may be formed on the first contact plug 106 within the second opening 112. In one embodiment, the second contact plug 114 may substantially fill the second opening 112.

In some embodiments, the second contact plug 114 may, for example, include a metal silicide layer 114a, a barrier metal layer 114a and a metal layer 114c. The metal silicide layer 114a may be formed in accordance with a reaction between the first contact plug 106 and the barrier metal layer 114b. The metal silicide layer 114a may serve as an ohmic layer.

In some embodiments, the second contact plug 114 may be formed according to a process that includes sequentially forming a metal film and a metal nitride film on the first contact plug 106, a sidewall of the second opening 112 and the second insulation layer 110. For example, the metal film and the metal nitride film may include titanium and titanium nitride, respectively. In one embodiment, the metal film and the metal nitride film may be formed by a sputtering process, a CVD process, an atomic layer deposition (ALD) process, an evaporation process, or the like or a combination thereof. In some embodiments, the first contact plug 106 may be reacted with the metal film so that a metal silicide layer 114a is foamed between the first contact plug 106 and the metal film when the metal film is formed on the first contact plug 106. The metal film and the metal nitride film may serve as the metal barrier layer 114b. Then, the metal layer 114c may be formed on the metal nitride film to fill the second opening 112. For example, the metal layer 114c may include tungsten and be formed by a sputtering process, a CVD process, an ALD process, an evaporation process, or the like or a combination thereof. The metal layer 114c and the barrier metal layer 114b may be partially removed by, for example, a CMP process and/or an etch-back process, respectively, so that an upper surface of the second insulation layer 110 is substantially coplanar with an upper surface of the second contact plug 114.

In some embodiments, a conductive line (not illustrated) may be provided on the second contact plug 114 and the second insulation layer 110. The conductive line may be electrically connected to the contact region through the first contact plug 106 and the second contact plug 114. The conductive line may, for example, include a metal formed by a sputtering process, a CVD process, an ALD process, an evaporation process, or the like or a combination thereof. In one embodiment, the conductive line and the metal layer 114c may be simultaneously formed.

Figure 7:
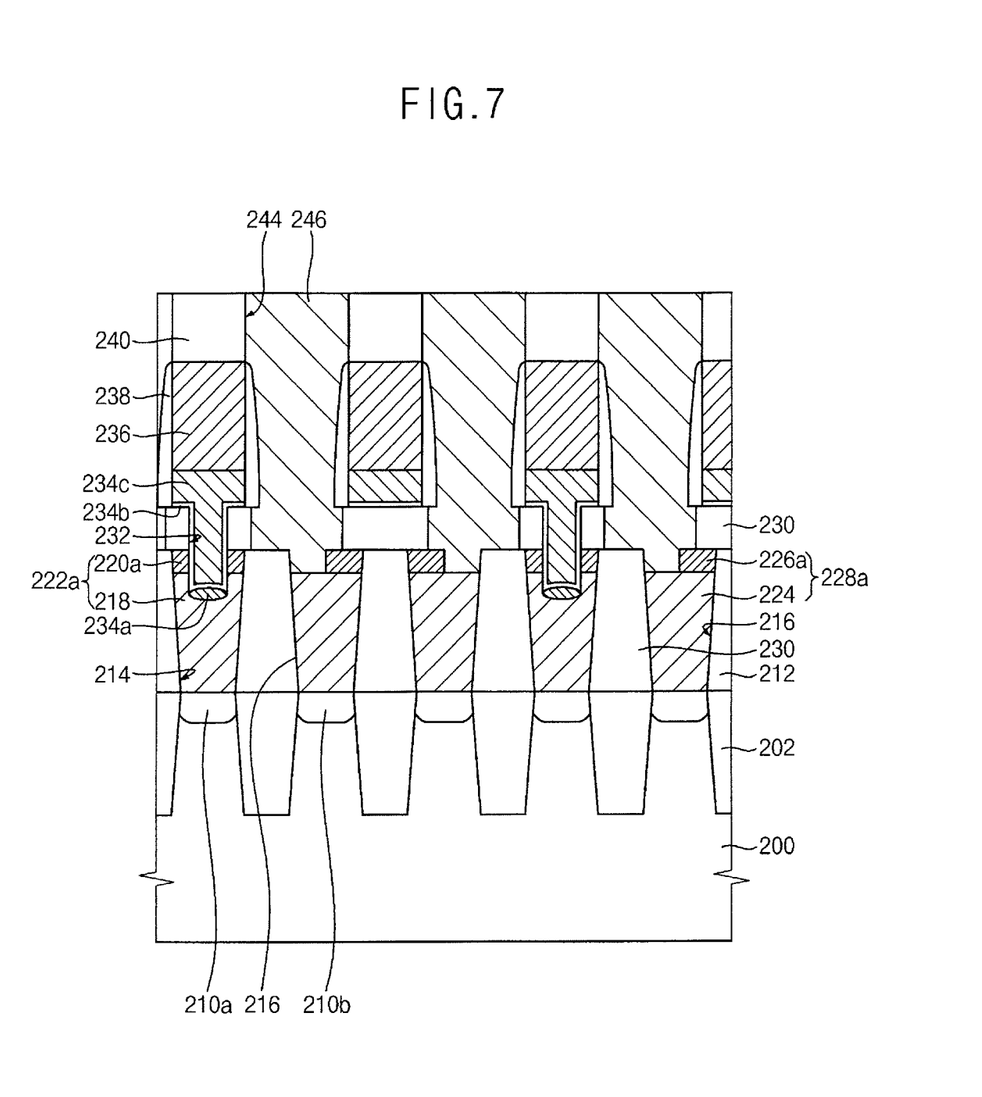
FIG. 7 is a cross-sectional view illustrating one embodiment of a semiconductor device including the wiring structure similar to that in FIG. 1.

FIG. 7 is a cross-sectional view illustrating one embodiment of a semiconductor device including the wiring structure similar to that illustrated in FIG. 1.

In FIG. 7, the illustrated semiconductor device includes a volatile memory semiconductor device such as a dynamic random access memory (DRAM) device. It will be appreciated, however, that a wiring structure such as that in FIG. 1, or similar thereto, may be advantageously used in other volatile semiconductor devices or non-volatile memory semiconductor devices (e.g., static random access memory (SRAM) devices, flash memory devices, etc.). Additionally, the cross-section of the semiconductor device may be obtained along a direction substantially parallel to a bit line.

Referring to FIG. 7, an isolation layer 202 is formed on a substrate 200 to divide the substrate 200 into an active region and a field region. The isolation layer 202 may include an oxide such as silicon oxide.

In some embodiments, the active region may be formed along a diagonal direction. For example, the active region may be formed along a diagonal direction relative to a first direction that is substantially parallel to a flat zone of the substrate 200.

Transistors such as metal oxide semiconductor (MOS) transistors may be formed in the active region of the substrate 200. Gate electrodes of the transistors may extend along a second direction to provide a word line of the semiconductor device. The second direction may be substantially perpendicular to the first direction. Two transistors may, for example, be positioned in one active region of the substrate 200.

In some embodiments, each of the transistors may include a gate structure, a first impurity region 210a and a second impurity region 210b. The gate structure may include a gate insulation layer pattern, a gate electrode and a gate mask. Additionally, a gate spacer may be provided on a sidewall of the gate structure. The first and the second impurity regions 210a and 210b may be formed at portions of the active region adjacent to the gate structure. The first and the second impurity regions 210a and 210b may serve as source/drain regions. A bit line of the semiconductor device may electrically contact the first impurity region 210a and a capacitor of the semiconductor device may electrically contact the second impurity region 210b.

A first insulating interlayer 212 may be formed on the substrate 200 to cover the transistors. The first insulating interlayer 212 may, for example, include an oxide such as silicon oxide. A first opening 214 and a second opening 216 may be formed through the first insulating interlayer 212. The first and the second openings 214 and 216 may expose the first and the second impurity regions 210a and 210b, respectively.

A first contact structure 222a may be formed in the first opening 214 and a second contact structure 228a may be formed in the second opening 216. The first and the second contact structures 222a and 228a may be electrically connected to the first and the second impurity regions 210a and 210b. In some embodiments, the first contact structure 222a may electrically connect the bit line to the first impurity region 210a and the second contact structure 228a may electrically connect the capacitor to the second impurity region 210b.

The first contact structure 222a may, for example, include a first contact plug 218 and a first capping layer pattern 220a. The second contact structure 228a may, for example, include a second contact plug 224 and a second capping layer pattern 226a.

The first and the second contact plugs 218 and 224 may, for example, include doped polysilicon, metal, metal nitride, or the like or a combination thereof. The first and the second capping layer patterns 220a and 226a may: for example, include silicon nitride or silicon oxynitride.

In some embodiments, a height of the first contact plug 218 may be substantially the same as a height of the second contact plug 224. When a height of each of the first and the second contact plugs 218 and 224 is below about 60 percent of the depth of each of the first and the second openings 214 and 216, respectively, each of the first and the second capping layer patterns 220a and 226a may be relatively thick. Accordingly, a bit line contact structure and a storage node contact plug 246 may not easily make contact with the first contact plug 218 and the second contact plug 224, respectively. However, when a height of each of the first and the second contact plugs 218 and 224 is above about 90 percent of the depth of each of the first and the second openings 214 and 216, respectively, each of the first and the second capping layers 220a and 226a may be relatively thin. Thus, the first and the second capping layer patterns 220a and 226a may not properly prevent chemicals from permeating into the first contact plug 218 and the second contact plug 224. As a result, a height of each of the first and the second contact plugs 218 and 224 may range from about 60 to about 90 percent of the depth of each of the first and the second openings 214 and 216, respectively.

Upper surfaces of the first and the second capping layer patterns 220a and 226a may be substantially coplanar with or lower than an upper surface of the first insulating interlayer 212.

In some embodiments, the first capping layer pattern 220a may enclose a lower portion of a bit line contact structure. The first capping layer pattern 220a may cover an entirety of a peripheral region of the upper surface of the first contact plug 218 and may also contact a sidewall of the first opening 214. Accordingly, the first capping layer pattern 220a may be characterized as having a ring structure, a hollow polygonal pillar structure, a cylindrical structure, a cup structure, etc., wherein only a central region of the first contact plug 218 is exposed by the first capping layer pattern 220a. The second capping layer pattern 226a may partially cover a peripheral region of the upper surface of the second contact plug 224. Accordingly, both a central and a peripheral region of the second contact plug 224 may be exposed by the second capping layer pattern 226a.

A second insulating interlayer 230 may be formed on the first insulating interlayer 212 to cover the first and the second capping layer patterns 220a and 226a. The second insulating interlayer 230 may, for example, include an oxide such as silicon oxide.

A third opening 232 may be formed through the second insulating interlayer 230 to expose the first contact plug 218. In one embodiment, the third opening 232 is formed through the second insulating interlayer 232 and the first capping layer pattern 220a.

A bit line may be formed on the first contact structure 222a and the second insulating interlayer 230 to fill the third opening 232. The bit line may, for example, include a bit line contact structure, a bit line mask 236 and a bit line spacer 238.

The bit line contact structure may be formed on the exposed portion of the first contact plug 218 and the second insulating interlayer 230. In one embodiment, the bit line contact structure includes a barrier metal layer 234b and a metal layer 234c. The barrier metal layer 234b may be formed on the first contact plug 218 and a sidewall of the third opening 232. The barrier metal layer 234b may have a multi-layered structure that includes, for example, a metal film and a metal nitride film. For example, the metal film and the metal nitride film may include titanium and titanium nitride, respectively. The metal layer 234c may be formed on the barrier metal layer 234b to fill the third opening 233. For example, the metal layer 234c may include tungsten, titanium, aluminum, copper, tantalum, or the like or a combination thereof. In the illustrated embodiment, an upper surface of the metal layer 234c protrudes over an upper surface of the second insulating interlayer 230.

In some embodiments, the bit line contact structure may further include a metal silicide layer 234a formed between the first contact plug 218 and the barrier metal layer 234b. The metal silicide layer 234a may be formed in accordance with a reaction between the first contact plug 218 and the metal barrier layer 234b. For example, the metal silicide layer 234a may include titanium silicide, cobalt silicide, tantalum silicide, tungsten silicide, etc. The metal silicide layer 234a may serve as an ohmic layer between the first contact structure 222a and the bit line contact structure.

In some embodiments, a width of a lower portion of the bit line contact structure may be substantially less than a width of an upper portion of the first contact plug 218. The first capping layer pattern 220a may enclose the lower portion of the bit line contact structure. Thus, the first capping layer pattern 220a may effectively prevent a permeation of the chemicals into the first contact plug 218 in successive cleaning or etching processes.

The bit line mask 236 may be formed on the metal layer 234c of the bit line contact structure and the bit line spacer 238 may be positioned on sidewalls of the bit line contact and the bit line mask 236. Each of the bit line mask 236 and the bit line spacer 238 may include a material having an etching selectivity relative to the metal layer 234c and the second insulating interlayer 230. For example, the bit line mask 236 and the bit line spacer 238 may include silicon nitride or silicon oxynitride. In example embodiments, the bit line may extend along a direction substantially perpendicular to a word line.

A third insulating interlayer 240 may be provided on the second insulating interlayer 230 to cover the bit line. The third insulating interlayer 240 may, for example, include an oxide such as silicon oxide.

A fourth opening 244 may be formed through the third insulating interlayer 240 and the second insulating interlayer 230 to partially expose the second contact plug 224 of the second contact structure 228a. In some embodiments, the fourth opening 244 may extend through a portion of the first insulating interlayer 212. In some embodiments, the fourth opening 244 may be formed using a self-aligned process. Accordingly, the fourth opening 244 may be self-aligned with respect to the bit line spacer 238. In one embodiment, a width of a lower portion of the fourth opening 244 may be greater than a width of an upper portion thereof. In another embodiment, the width of a lower portion of the fourth opening 244 formed through the second insulating interlayer 230 may be wider than a width of an upper portion of the fourth opening 244 formed through the third insulating interlayer 240. Accordingly, a contact area between the second contact plug 224 and a storage node contact plug 246 may be enlarged.

The storage node contact plug 246 may be formed in the fourth opening 244. The storage node contact plug 246 may be electrically connected to the second impurity region 210b through the second contact structure 228a. The storage node contact plug 246 may contact the bit line spacer 238. Since a lower portion of the fourth opening 244 is larger than the upper portion thereof, a lower portion of the storage node contact plug 246 may be wider than an upper portion thereof. That is, the lower portion of the storage node contact plug 246 may be enlarged between the third insulating interlayer 240 and the second insulating interlayer 230.

In some embodiments, a capacitor (not illustrated) may be formed on the storage node contact plug 246 and the third insulating interlayer 240. The capacitor may, for example, include a lower electrode, a dielectric layer and an upper electrode. For example, the capacitor may have a cylindrical structure.

FIGS. 8 to 13 are cross-sectional views illustrating an example method of manufacturing the semiconductor device in FIG. 7.

Figure 8:
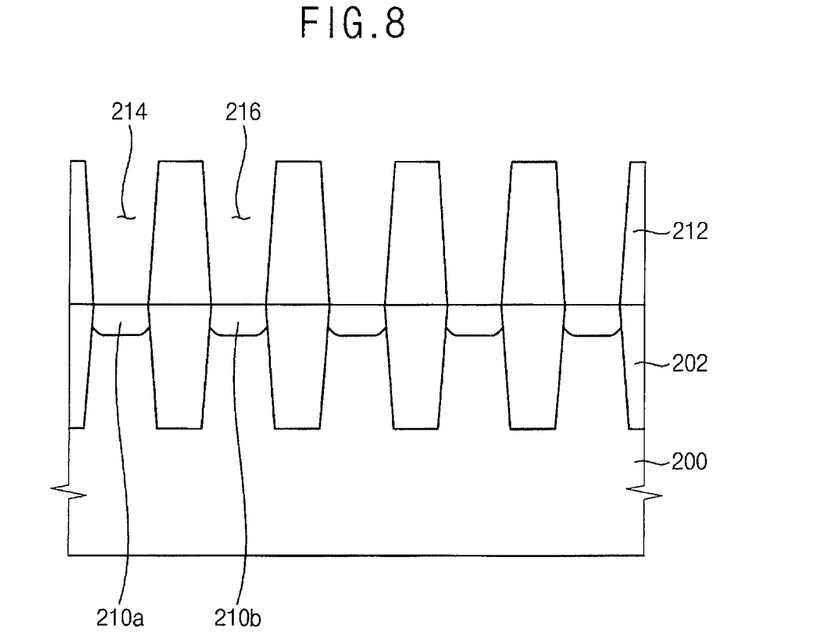
FIGS. 8 to 13 are cross-sectional views illustrating an example method of manufacturing the semiconductor device in FIG. 7.

Referring to FIG. 8, an isolation layer 202 may be formed on a substrate 200 to define an active region and a field region of the substrate 200. The active region may be formed along a diagonal direction relative to a first direction substantially parallel to a flat zone of the substrate 200. The isolation layer 202 may, for example, include an oxide by a shallow trench isolation (STI) process or a thermal oxidation process.

In one embodiment, the isolation layer 202 may be formed by forming a buffer oxide layer on the substrate 200 and then forming a nitride layer on the buffer oxide layer. The buffer oxide layer may reduce a stress generated in a formation of the nitride layer on the substrate 200. The buffer oxide layer and the nitride layer may, for example, include silicon oxide and silicon nitride, respectively. The nitride layer may be partially etched to form a mask pattern on the buffer oxide layer. The buffer oxide layer and the substrate 200 may be partially etched to form a buffer oxide layer pattern and a trench at an upper portion of the substrate 200. An oxide layer may be formed on the mask pattern to fill the trench and then the oxide layer may be partially removed until the mask pattern is exposed. When the mask pattern and the buffer oxide layer are removed from the substrate 200, the isolation layer 202 is formed to fill the trench.

A gate insulation layer may be formed on the active region of the substrate 200. The gate insulation layer may, for example, include a material such as silicon oxide, metal oxide, or the like or a combination thereof. After a gate conductive layer and a gate mask layer are formed on the gate insulation layer, the gate mask layer, the gate conductive layer and the gate insulation layer may be sequentially etched to form a gate structure on the active region. The gate conductive layer may, for example, include doped polysilicon, metal, metal nitride and/or metal silicide. The gate structure may include a gate insulation layer pattern, a gate electrode and a gate mask. The gate structure may extend along the first direction to form a word line of the semiconductor device. In some embodiments, two gate structures may be provided in one active region of the substrate 200.

A gate spacer may be formed on a sidewall of the gate structure. The gate spacer may, for example, include a nitride such as silicon nitride. Using the gate structure as an implantation mask, impurities may be doped into portions of the active region adjacent to the gate structure. Thus, a first impurity region 210a and a second impurity region 210b may be formed adjacent to the gate structure. The first and the second impurity regions 210a and 210b may correspond to source/drain regions. Additionally, a bit line and a capacitor may be electrically connected to the first impurity region 210a and the second impurity region 210b, respectively.

Referring still to FIG. 8, a first insulating interlayer 212 may be formed on the substrate 200 to cover the gate structure. The first insulating interlayer 212 may, for example, include an oxide such as silicon oxide formed by a CVD process.

The first insulating interlayer 212 may then be partially etched to form a first opening 214 that exposes the first impurity region 210a and a second opening 216 that exposes the second impurity region 210b. The first and the second openings 214 and 216 may be formed by a wet etching process or a dry etching process. In some embodiments, the first and the second openings 214 and 216 may be self-aligned with respect to the gate spacer.

Figure 9:
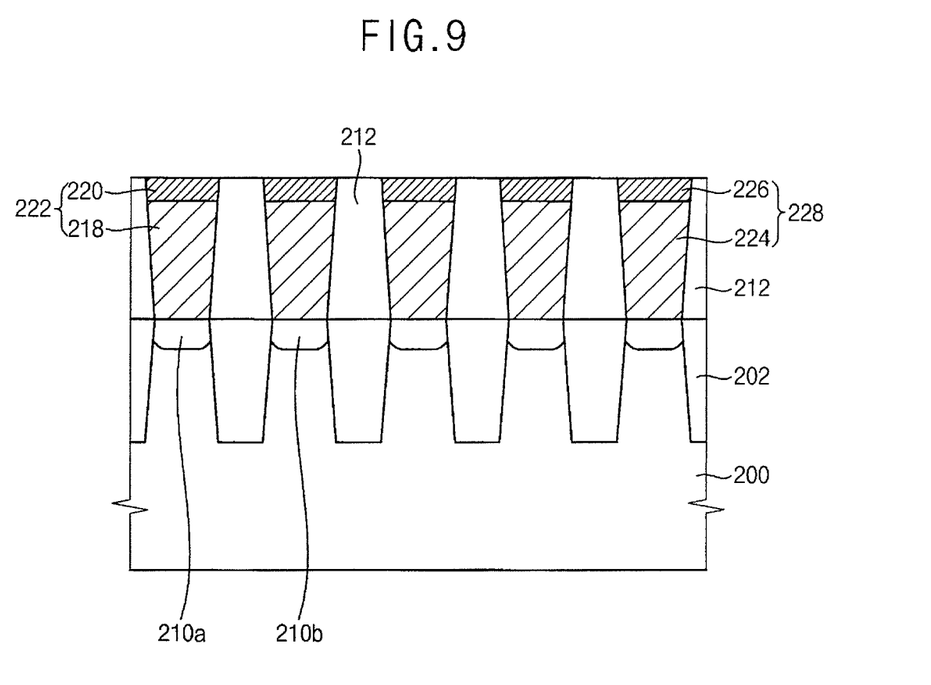

Referring to FIG. 9, a first conductive layer (not illustrated) may be formed on the first insulating interlayer 212 within to the first and second openings 214 and 216. In one embodiment, the first conductive layer substantially fills the first and the second openings 214 and 216. The first conductive layer may, for example, include doped polysilicon, metal, metal nitride, or the like or a combination thereof. Additionally, the first conductive layer may be formed by a sputtering process, a CVD process, an ALD process, an evaporation process, or the like or a combination thereof. In some embodiments, an upper surface of the first conductive layer may be planarized by a CMP process and/or an etch-back process.

The first conductive layer may then be partially removed to form a first contact plug 218 and a second contact plug 224. The first and the second contact plugs 218 and 224 may be formed by an etch-back process and/or a CMP process. The first and the second contact plugs 218 and 224 fill the first and the second openings 214 and 216, respectively such that a height of each of the first and the second contact plugs 218 and 224 ranges from about 60 to about 90 percent of the depth of each of the first and the second openings 214 and 216, respectively. Accordingly, the height of each of the first and the second contact plugs 218 and 224 may range from about 60 to about 90 percent of the thickness of the first insulating interlayer 212. An insulation layer (not illustrated) may then be formed on the first insulating interlayer 212 and within the first and second openings 214 and 216. In one embodiment, the insulation layer may substantially fill the first and the second openings 214 and 216. The insulation layer may, for example, include a nitride such as silicon nitride or an oxynitride such as silicon oxynitride.

The insulation layer may then be partially etched until the first insulating interlayer 212 is exposed, thereby forming a first preliminary capping layer pattern 220 and a second preliminary capping layer pattern 226 on the first contact plug 218 and the second contact plug 224, respectively. The first and the second preliminary capping layer patterns 220 and 226 may substantially fill the first and the second openings 214 and 216. The first and the second preliminary capping layer patterns 220 and 226 may be formed by a CMP process and/or an etch-back process.

An upper surface of each of the first and the second preliminary capping layer patterns 220 and 226 may be substantially coplanar with, or lower than, an upper surface of the first insulating interlayer 212.

When the first and the second preliminary capping layer patterns 220 and 226 are formed, a first preliminary contact structure 222 and a second preliminary contact structure 228 are formed on the substrate 200. Accordingly, the first preliminary contact structure 222 includes the first contact plug 218 and the first preliminary capping layer pattern 220 and the second preliminary contact structure 228 includes the second contact plug 224 and the second preliminary capping layer pattern 226.

When a capping layer pattern is formed on the first and the second contact plugs 218 and 224 after partially etching an upper portion of the first insulating interlayer 212 having the first and the second openings 214 and 216, a portion of the first insulating interlayer 212 positioned in a peripheral circuit region may be undesirably etched along with a portion of the first insulating interlayer 212 in the cell area. Because densities of patterns and structures in the peripheral circuit region may be lower than those of patterns and structures in the cell area, a step may be formed in the first insulating interlayer 212 between the peripheral circuit region and the cell region. When the step occurs between the peripheral circuit region and the cell region, subsequent patterns and/or layers may not be properly formed on the substrate 200 having the peripheral circuit and the cell regions. Hence, an additional layer for reducing the step may be formed on the substrate 200 after forming the capping layer pattern. Such an additional layer may be planarized by a planarization process. As a result, the method of manufacturing the semiconductor device may become complicated. However, according to the embodiments described above, the first and second preliminary capping layer patterns 220 and 226 are formed without partially etching the first insulating interlayer 212, so that a step is not generated between the peripheral circuit region and the cell region. Therefore, the method of manufacturing the semiconductor device may be simplified without requiring the formation and planarization of an additional layer.

Figure 10:
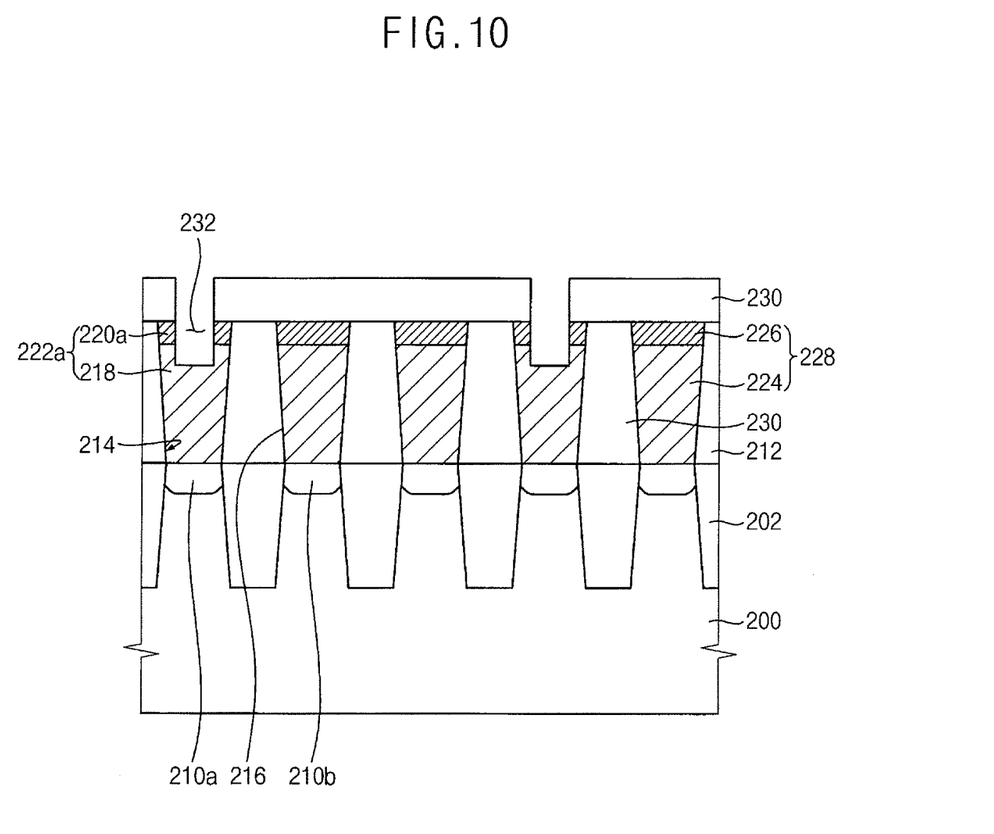

Referring to FIG. 10, a second insulating interlayer 230 may be formed on the first insulating interlayer 212, the first preliminary contact structure 222 and the second preliminary contact structure 228. The second insulating interlayer 230 may, for example, include an oxide such as silicon oxide and be formed by a CVD process.

The second insulating interlayer 230 and the first preliminary capping layer pattern 220 may then be partially etched to form a third opening 232 that exposes the first contact plug 218. Here, the first contact plug 218 may be partially etched. Upon forming the third opening 232, the first preliminary capping layer pattern 220 is patterned into a first capping layer pattern 220a. The first capping layer pattern 220a may have a ring structure, a hollow polygonal structure, a cylindrical structure, a cup structure, etc. A width of a lower portion of the first capping layer pattern 220a may be substantially smaller than a width of an upper portion of the first contact plug 218. When the first capping layer pattern 220a is formed, the first preliminary contact structure 222 is changed into a first contact structure 222a. Accordingly, the first contact structure 222a may include the first contact plug 218 and the first capping layer pattern 220a.

Figure 11:
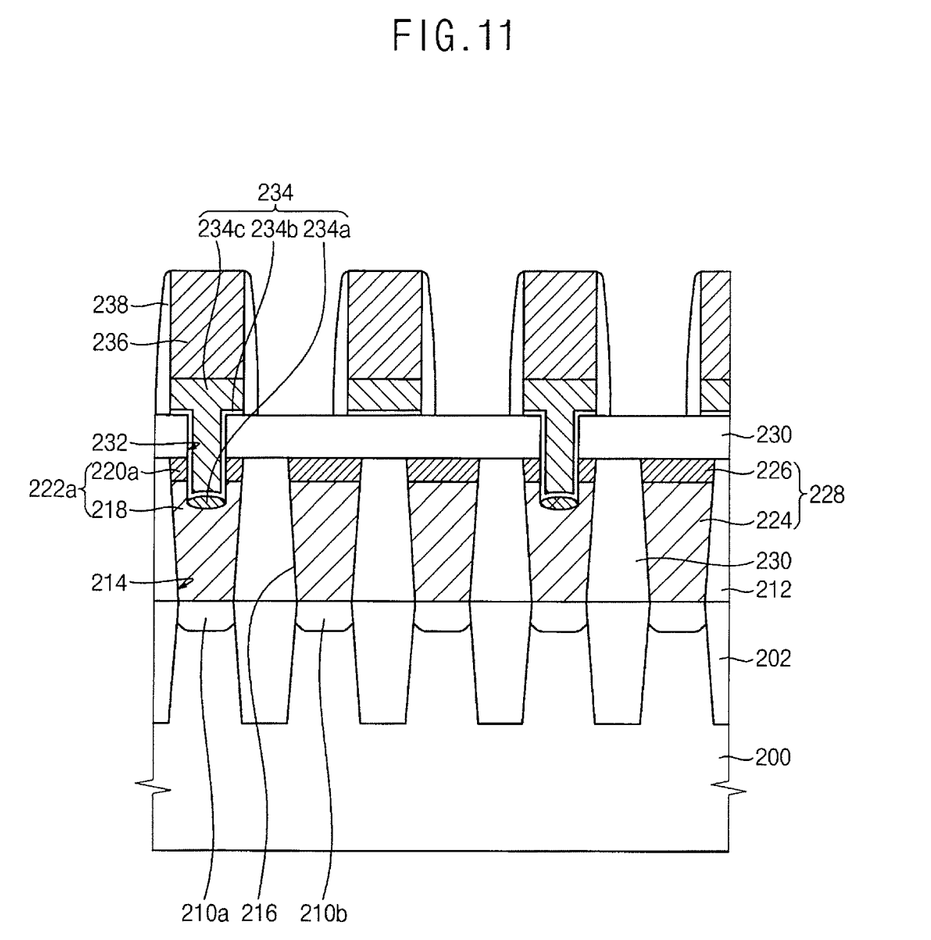

Referring to FIG. 11, a barrier metal layer 234b may then be formed on the first contact plug 218, a sidewall of the third opening 232 and the second insulating interlayer 230. A metal layer 234c may also be formed on the barrier metal layer 234b to fill the third opening 232.

The barrier metal layer 234b may be formed by sequentially forming a metal film and a metal nitride film on the first contact plug 218, a sidewall of the third opening 232 and the second insulating interlayer 230. Then, a metal film may be formed on the metal nitride film. The metal nitride film may, for example, include titanium nitride, tantalum nitride, aluminum nitride, tungsten nitride, titanium nitride, or the like or a combination thereof. The metal film may, for example, include tungsten, titanium, tantalum, aluminum, or the like of a combination thereof. The metal nitride film and the metal film may be formed by a sputtering process, a CVD process, an ALD process, an evaporation process, or the like of a combination thereof.

A metal silicide layer 234a may be formed between the first contact plug 218 and the barrier metal layer 234b in accordance with a reaction between the first contact plug 218 and the barrier metal layer 234b while forming the metal film on the first contact plug 218. The metal silicide layer 234a may serve as an ohmic layer to improve a contact resistance between first contact plug 218 and the barrier metal layer 234b.

A bit line mask 236 may then be formed on the metal layer 234c, and then the metal layer 234c and the barrier metal layer 234b may be patterned using the bit line mask 236 as an etching mask. Thus, a bit line contact structure may be formed on the first contact plug 218 and the second insulating interlayer 230. The bit line contact structure may, therefore, include the metal silicide layer 234a, the barrier metal layer 234b and the metal layer 234c. The first capping layer pattern 220a may enclose a lower portion of the bit line contact structure. The bit line mask 236 may, for example, include a nitride or an oxynitride.

When a bit line spacer 238 is formed on sidewalls of the bit line mask 236 and the bit line contact structure, the bit line including the bit line contact structure, the bit line mask 236 and the bit line spacer 238 is completed. The bit line spacer 238 may, for example, include nitride or oxynitride.

Figure 12:
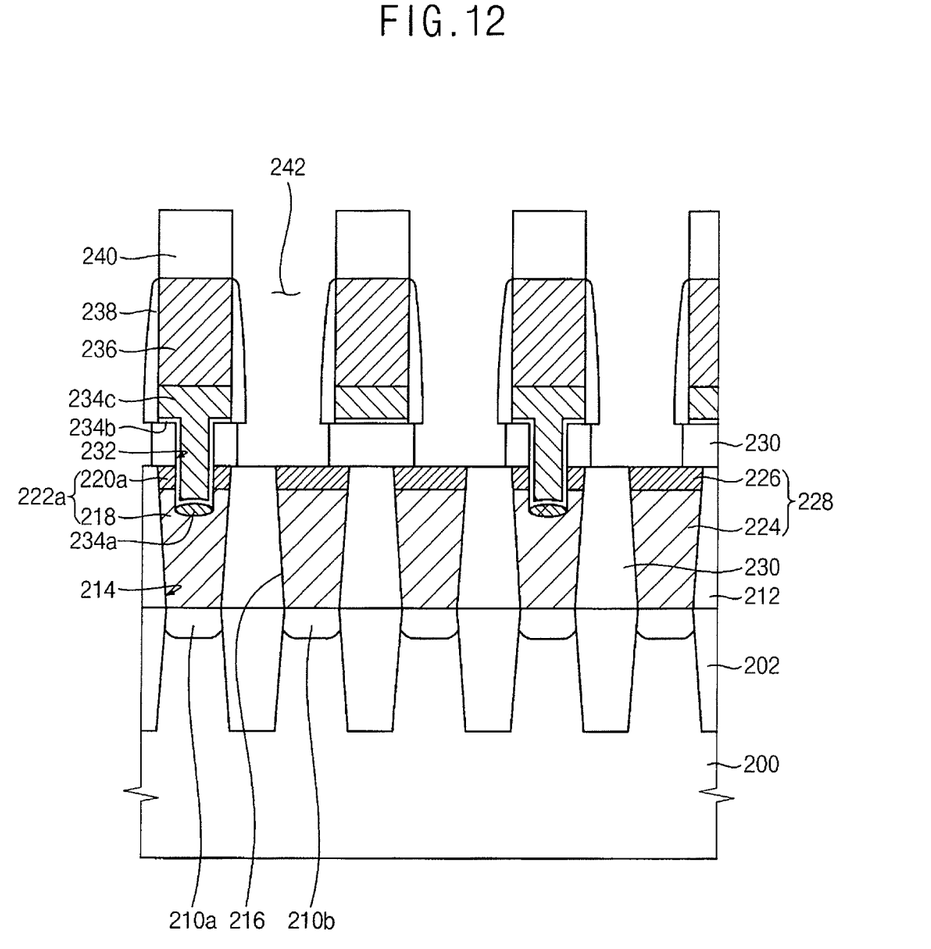

Referring to FIG. 12, a third insulating interlayer 240 may then be formed on the second insulating interlayer 230 to cover the bit line. The third insulating interlayer 240 may, for example, include an oxide and be formed by a CVD process. In some embodiments, the third insulating interlayer 240 may be planarized by a CMP process and/or an etch-back process to ensure a level surface thereof.

After a photoresist pattern (not illustrated) is then formed on the third insulating interlayer 240, the third insulating interlayer 240 and the second insulating interlayer 230 may be partially etched using the photoresist pattern as an etching mask. Thus, a preliminary fourth opening 242 may be formed though the third and the second insulating interlayers 240 and 230. The preliminary fourth opening 242 partially exposes the preliminary second capping layer pattern 226. The preliminary fourth opening 242 may extend alone a direction substantially perpendicular to the bit line. Further, the preliminary fourth opening 242 may be formed using an anisotropic etching process. Accordingly, the third and the second insulating interlayers 240 and 230 may be anisotropically etched to form the preliminary fourth opening 242.

In some embodiments, the preliminary fourth opening 242 may be formed such that a lower portion of the preliminary fourth opening 242 is larger (i.e., wider) than an upper portion of the preliminary fourth opening 242. The lower portion of the preliminary fourth opening 242 may be enlarged by an isotropic etching process. For example, the second insulating interlayer 230 may be partially etched by a wet etching process using an etching solution that etches the second insulating interlayer 230 selectively with respect to the third insulating interlayer 240. In one embodiment, the etching solution may include an ammonium fluoride ($NHF_4$) solution, a hydrogen fluoride (HF) solution and deionized water. Moreover, particular characteristics of the second and third insulating interlayers 230 and 240 may be adjusted to ensure that the second insulating interlayer 230 is etched selectively with respect to the third insulating interlayer 240. After enlarging the lower portion of the preliminary fourth opening 242, the preliminary fourth opening 242 may have an undercut between the lower portion and the upper portion of the preliminary fourth opening 242. As a result, the preliminary fourth opening 242 may have the lower portion substantially larger than the upper portion thereof.

In some embodiments, etch by-products and/or particles may be removed from inside of the preliminary fourth opening 242 while enlarging the lower portion of the preliminary fourth opening 242.

Conventionally, when openings are formed in insulating interlayers to expose underlying contact plugs, chemicals used to form the openings may permeate into the contact plugs. When the openings are formed according to a wet etching process, the chemicals used may easily permeate into a sidewall or a bottom of the contact plug. As a result, the contact plug may become damaged by the chemicals. Metal silicide layers may also be seriously damaged by chemicals. When the contact plug is damaged, a contact failure between the contact plug and an upper contact plug or an upper wiring may occur. As a result, the electrical characteristics of a semiconductor device including the damaged contact plug may become deteriorated. According to the embodiments exemplarily described above, however, the first contact structure 222a and the preliminary second contact structure 228 are not damaged while forming the preliminary fourth opening 242 through the second and the third insulating interlayers 230 and 240 because the first capping layer pattern 220a and the second preliminary capping layer pattern 226 effectively protects the first contact plug 218 and the second contact plug 224 from chemicals used to form the preliminary fourth opening 242. Further, the bit line contact structure may also be effectively protected from the chemicals without a contact failure between the first contact structure 222a and the bit line contact structure because the first capping layer pattern 220a can enclose the lower portion of the bit line contact structure. Therefore, the semiconductor device including such contact structures may have improved electrical characteristics.

Figure 13:
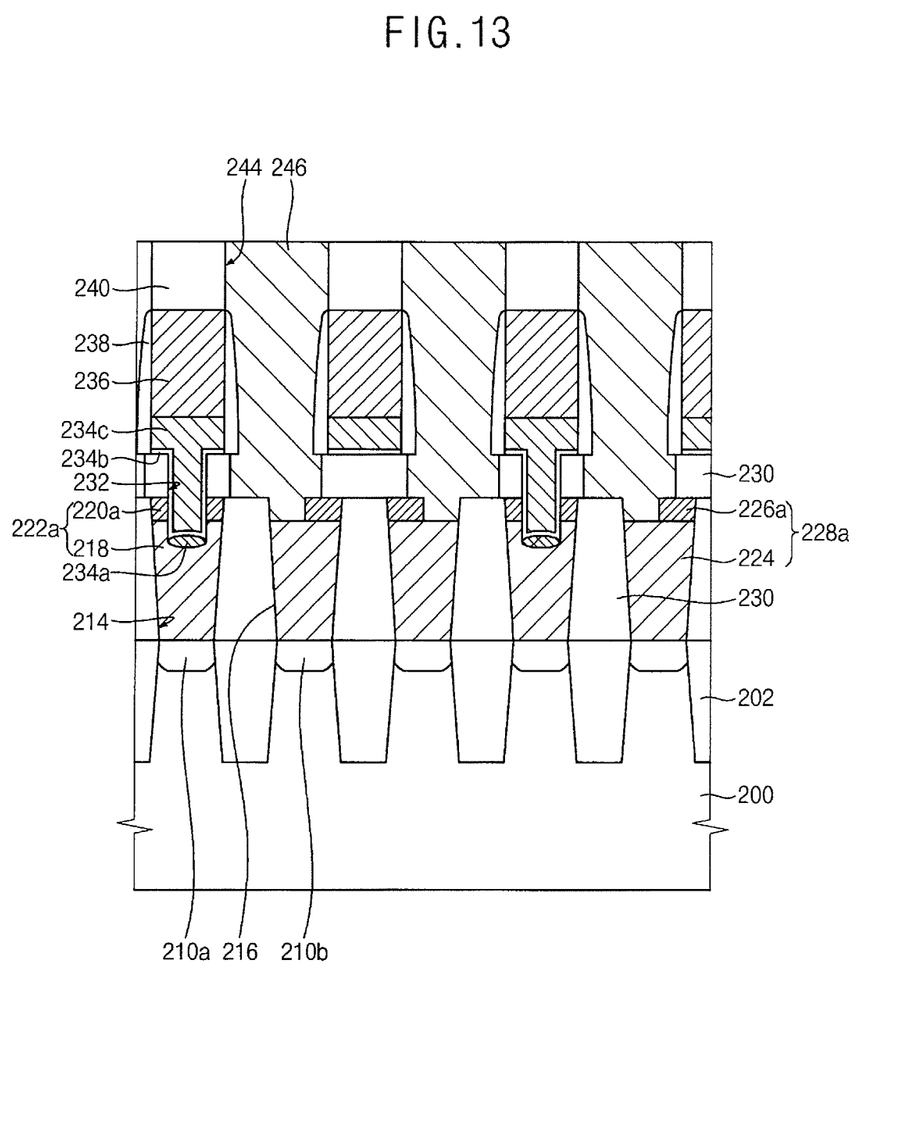

Referring to FIG. 13, a portion of the preliminary second capping layer 242 exposed by the preliminary fourth opening 242 is etched to thereby form a fourth opening 244 and a second capping layer 226a. The fourth opening 244 partially exposes the second contact plug 224. When the second capping layer 226a is formed, a second contact structure 228a is formed in the second opening 216. The second contact structure 228a includes the second contact plug 224 and the second capping layer pattern 226a.

An upper conductive layer (not illustrated) may then be formed on second contact plug 224 and the third insulating interlayer 240 to fill the fourth opening 244. The upper conductive layer may, for example, include metal, metal nitride, doped polysilicon, or the like or a combination thereof. For example, the upper conductive layer may be formed using tungsten, titanium, aluminum, titanium nitride, tungsten nitride, aluminum nitride, or the like or a combination thereof. Further, the upper conductive layer may be formed by a sputtering process, a CVD process, an ALD process, an evaporation process, or the like or a combination thereof.

The upper conductive layer may be partially removed until the third insulating interlayer 240 is exposed. Thus, a storage node contact plug 246 may be formed on the second contact plug 224 in the fourth opening 244. The upper conductive layer may be partially removed by a CMP process and/or an etch-back process. The storage node contact plug 246 may be electrically connected to the second impurity region 210b through the second contact plug 224.

After a lower electrode (not illustrated) is formed on the storage node contact plug 246, a dielectric layer (not illustrated) and an upper electrode (not illustrated) may be sequentially formed to complete formation of a capacitor over the substrate 200.

According to example embodiments described above, a wiring structure in a semiconductor device may include a capping layer pattern for preventing chemicals from permeating into a lower contact plug of the wiring structure. Hence, a contact failure between the lower contact plug and an upper contact plug may be effectively prevented. When the semiconductor device includes the wiring structure, the semiconductor device may have improved electrical characteristics.

The foregoing description is illustrative of the present invention and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A semiconductor device comprising:
    a first insulation layer disposed on a substrate, the first insulation layer having a first opening that exposes an impurity region of the substrate;
    a contact plug disposed within the first opening and on the impurity region;
    a second insulation layer disposed on the first insulation layer, the second insulation layer having a second opening defined therein;
    an electrically conductive pattern disposed within the second opening and on the contact plug; and
    an insulating pattern disposed on the contact plug and between the first insulation layer and the electrically conductive pattern,
    wherein the uppermost portion of the contact plug is fully recessed such that the uppermost surface of the contact plug is disposed under the uppermost surface of the first insulation layer.

2. The semiconductor device of claim 1, wherein the uppermost surface of the contact plug directly contacts the lowermost surface of the electrically conductive pattern.

3. The semiconductor device of claim 1, wherein the insulating pattern comprises at least one of silicon nitride or silicon oxynitride.

4. The semiconductor device of claim 1, wherein the insulating pattern has one of a ring structure, or a cylindrical structure.

5. The semiconductor device of claim 1, wherein the impurity region is one of a source region or a drain region.

6. The semiconductor device of claim 1, wherein the first and second insulation layers comprise silicon oxide.

7. The semiconductor device of claim 1, wherein the contact plug and the electrically conductive pattern comprise at least one of doped polysilicon, metal, metal nitride, or a combination thereof.

8. The semiconductor device of claim 1, wherein a height of the contact plug ranges from about 60 to about 90 percent of a depth of the first opening.

* * * * *